(12) United States Patent
Kim et al.

(10) Patent No.: US 7,067,390 B2
(45) Date of Patent: Jun. 27, 2006

(54) METHOD FOR FORMING ISOLATION LAYER OF SEMICONDUCTOR DEVICE

(75) Inventors: Su Ho Kim, Kyoungki-do (KR); Yun Hyuck Ji, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 120 days.

(21) Appl. No.: 10/889,480

(22) Filed: Jul. 12, 2004

(65) Prior Publication Data
US 2005/0118786 A1 Jun. 2, 2005

(30) Foreign Application Priority Data
Nov. 27, 2003 (KR) ............... 10-2003-0084920

(51) Int. Cl.
*H01L 21/76* (2006.01)

(52) U.S. Cl. ............... 438/435; 438/756; 438/737

(58) Field of Classification Search ........... 438/435, 438/789, 790, 424, 437, 692, 756, 737
See application file for complete search history.

(56) References Cited

U.S. PATENT DOCUMENTS

| | | | |
|---|---|---|---|
| 6,861,334 B1* | 3/2005 | Raaijmakers et al. | 438/435 |
| 2002/0102814 A1* | 8/2002 | Olsen | 438/424 |
| 2002/0117731 A1* | 8/2002 | Kim et al. | 257/510 |
| 2003/0015764 A1* | 1/2003 | Raaijmakers et al. | 257/424 |

* cited by examiner

*Primary Examiner*—Caridad Everhart
(74) *Attorney, Agent, or Firm*—Ladas & Parry LLP

(57) ABSTRACT

Disclosed is a method for forming an isolation layer of a semiconductor device. The method includes the steps of providing a semiconductor substrate having a predetermined isolation region, sequentially forming a pad oxide layer and a pad nitride layer exposing the predetermined isolation region on the semiconductor substrate, forming a trench through etching the semiconductor substrate by a predetermined thickness using the pad nitride layer as a mask, forming a wall oxide layer at a side wall of the trench, sequentially forming a nitride layer and an oxide layer on a trench structure including the wall oxide layer, forming an $Al_2O_3$ layer on an entire surface of a resultant structure, planarizing the Al2O3 layer through polishing the Al2O3 layer, and forming the isolation layer by removing the pad nitride layer.

10 Claims, 4 Drawing Sheets

METHOD FOR FORMING ISOLATION LAYER OF SEMICONDUCTOR DEVICE

BACKGROUND OF THE INVENTION

1. Field of the Invention

The present invention relates to a method for fabricating a semiconductor device, and more particularly to a method for forming an insulation layer of a semiconductor device capable of preventing an oxide layer from being damaged in a following wet-etch process by using an $Al_2O_3$ layer as the oxide layer filling a trench in an STI (shallow trench isolation) process of a DRAM device.

2. Description of the Prior Art

In general, as semiconductor techniques have been developed, semiconductor devices are highly integrated with high operational speed. Accordingly, a micro pattern of the semiconductor device is gradually required, and preciseness for a dimension of the pattern may be highly required. Such a high integration of the semiconductor device and preciseness of the pattern are also required in an isolation region occupying a large area of the semiconductor device.

An LOCOS (local oxidation of silicon) oxide layer is mainly used as an isolation layer of the semiconductor device. An LOCOS isolation layer is formed by selectively and locally oxidizing a predetermined portion of a substrate.

However, the LOCOS isolation layer forms a bird's-beak at an edge portion thereof, so the bird's-beak may increase an area of the isolation layer while generating leakage current.

For this reason, an STI (shallow trench isolation) type isolation layer having a small width and a superior isolation characteristic has been proposed. Hereinafter, a conventional method for forming an isolation layer will be explained with reference to FIGS. 1a to 1d.

FIGS. 1a to 1d are sectional views showing a conventional method for forming an isolation layer of a semiconductor device by using an STI process.

According to the conventional method for forming the isolation layer, as shown in FIG. 1a, a pad oxide layer 12 and a pad nitride layer 13 are sequentially formed on a silicon substrate 11. Then, the pad nitride layer 13 and the pad oxide layer 12 are patterned through a lithography process, thereby exposing a predetermined portion of the silicon substrate 11, which is corresponding to an isolation region. Then, the exposed portion of the silicon substrate 11 is etched with a predetermined depth, thereby forming a trench 14.

Thereafter, as shown in FIG. 1b, in order to remove stress created when the trench 14 is etched while protecting the silicon substrate 11, a sacrificial oxide layer (not shown) is formed on the silicon substrate 11 having the trench 14 and is removed. Then, a thin oxide layer 15 is formed through a sidewall oxidation process. At this time, a process for forming the sacrificial oxide layer can be omitted.

Thereafter, a predetermined nitride layer 16 and a predetermined oxide layer 17 are sequentially formed on an upper surface of a resultant structure, on which the thin oxide layer 15 is formed. At this time, the nitride layer 16 may reduce a depth of a moat formed at a predetermined portion, in which a silicon active region meets the isolation layer, based on an etching selectivity between the nitride layer and the isolation layer.

Then, a gap-fill oxide layer 18 is deposited on a resultant structure through an HDP-CVD (high density plasma-chemical vapor deposition) process such that the trench 14 is completely filled up by the oxide layer.

Thereafter, as shown in FIG. 1c, the gap-fill oxide layer, the oxide layer, and the nitride layer are polished through a CMP (chemical mechanical polishing) process in order to expose the pad nitride layer 13.

Then, as shown in FIG. 1d, the pad nitride layer is removed through a wet-etch process using phosphoric acid solution. After that, the pad oxide layer is removed by dipping a resultant substrate in fluoride acid solution, thereby forming a trench type isolation layer 17.

As described above, according to a conventional method, an HDP oxide layer is used as the gap-fill oxide layer filling a trench for isolating a device. However, even though the HDP oxide layer can fill a gap in a small space, loss of the oxide layer is generated in the following wet-etch process using chemicals, such as phosphoric acid and fluoride acid.

Accordingly, a height of the isolation layer is reduced, and a silicon substrate is exposed from a sidewall of a trench so that a size of a device region becomes reduced in a vertical direction. Thus, threshold voltage is reduced, lowering reliability of a semiconductor device.

SUMMARY OF THE INVENTION

Accordingly, the present invention has been made to solve the above-mentioned problems occurring in the prior art, and an object of the present invention is to provide a method for forming an isolation layer of a semiconductor device capable of adjusting a size of a device region by utilizing an $Al_2O_3$ layer, instead of an HDP oxide layer, as a gap filling oxide layer, thereby preventing an oxide layer from being lost during the following wet-etch process.

In order to accomplish this object, there is provided a method for forming an isolation layer of a semiconductor device, the method comprising the steps of: providing a semiconductor substrate having a predetermined isolation region; sequentially forming a pad oxide layer and a pad nitride layer exposing the predetermined isolation region on the semiconductor substrate; forming a trench through etching the semiconductor substrate by a predetermined thickness using the pad nitride layer as a mask; forming a wall oxide layer at a side wall of the trench; sequentially forming a nitride layer and an oxide layer on a trench structure including the wall oxide layer; forming an $Al_2O_3$ layer on an entire surface of a resultant structure; planarizing the Al2O3 layer through polishing the Al2O3 layer; and forming the isolation layer by removing the pad nitride layer.

According to the preferred embodiment of the present invention, the $Al_2O_3$ layer is deposited under a temperature of about 300~500° C. and pressure of about 0.1~5 torr, and a deposition process for the $Al_2O_3$ layer is carried out in single type equipment or batch type equipment.

According to the preferred embodiment of the present invention, the $Al_2O_3$ layer is formed by using one of trimethyl-aluminum and triethyl-aluminum as a source.

According to the preferred embodiment of the present invention, the $Al_2O_3$ layer is formed in HF chemical having a ratio of 50:1 with a wet-etch rate less than 0.5 Å/sec.

BRIEF DESCRIPTION OF THE DRAWINGS

The above object, features and advantages of the present invention will be more apparent from the following detailed description taken in conjunction with the accompanying drawings, in which.

DETAILED DESCRIPTION OF THE PREFERRED EMBODIMENTS

Figure 1A:
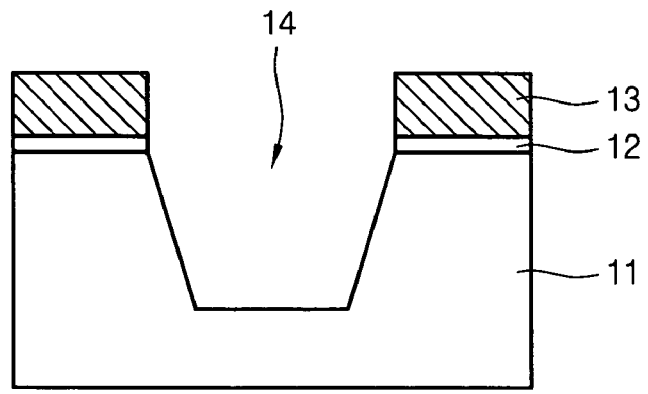
FIGS. 1a to 1d are sectional views showing a conventional method for forming an isolation layer of a semiconductor device by using an STI process.
Figure 1B:
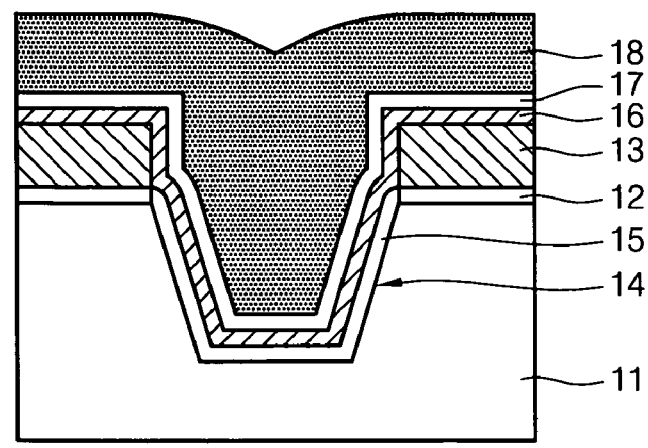
Figure 1C:
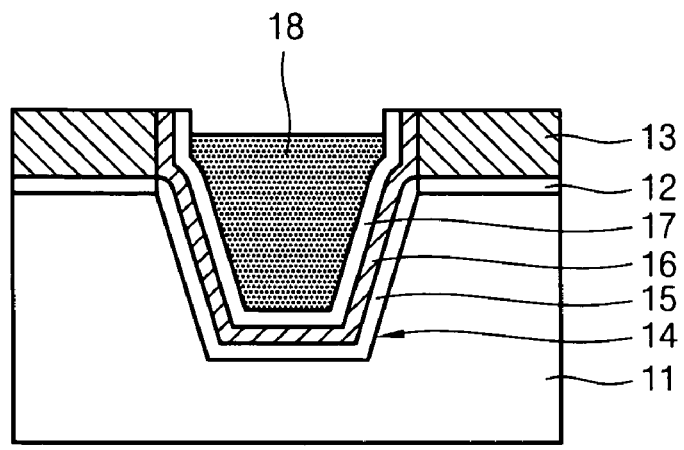
Figure 1D:
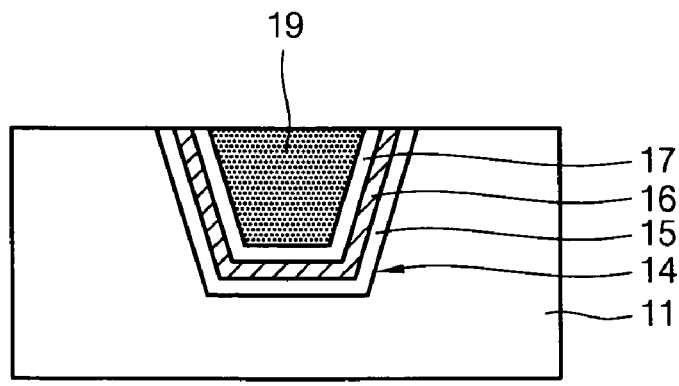

Hereinafter, a method for forming an isolation layer of a semiconductor device according to one embodiment of the present invention will be described with reference to the accompanying drawings. In the following description and drawings, the same reference numerals are used to designate the same or similar components, and so repetition of the description on the same or similar components will be omitted.

FIGS. 2a to 2d are sectional views showing a method for forming an isolation layer of a semiconductor device according to one embodiment of the present invention.

Figure 2A:
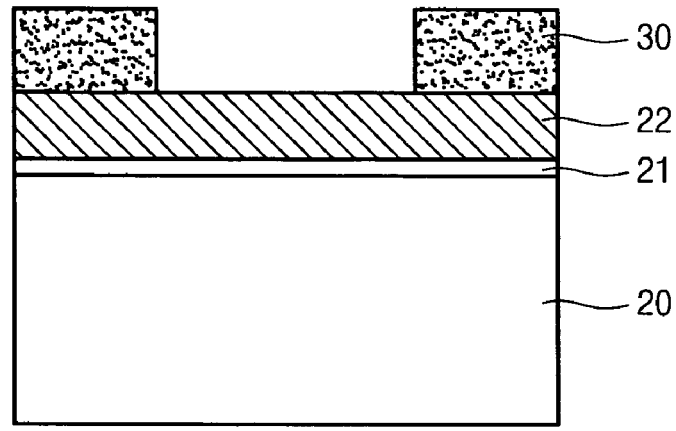
FIGS. 2a to 2d are sectional views showing a method for forming an isolation layer of a semiconductor device according to one embodiment of the present invention.

As shown in FIG. 2a, according to the method for forming the isolation layer of the semiconductor device of the present invention, a silicon substrate 20 having a predetermined isolation region is provided. Then, after a pad oxide layer 21 having a thickness of about 100Å and a pad nitride layer 22 having a thickness of about 1,400Å are sequentially formed on the silicon substrate 20, a photoresist film is coated on the pad nitride layer 22. Thereafter, an exposure and development process is carried out with respect to the photoresist film, thereby forming a photoresist film pattern 30 exposing the predetermined isolation region.

Figure 2B:
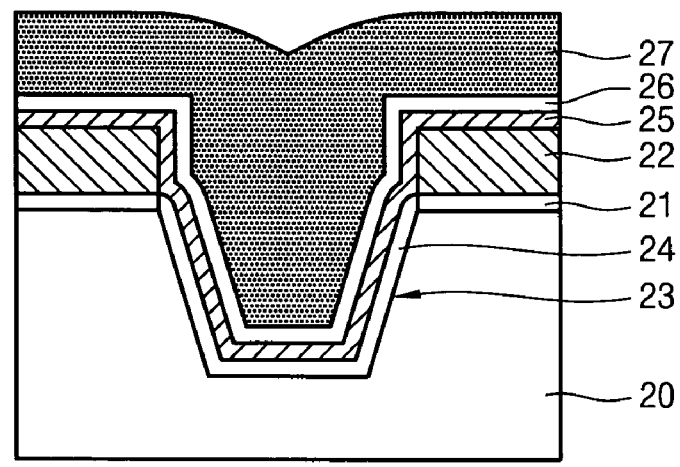

After that, as shown in FIG. 2b, the pad nitride layer 22 and the pad oxide layer 21 are patterned through a lithography process by using the photoresist film pattern as a mask in order to expose a predetermined portion of the silicon substrate 20 corresponding to the predetermined isolation region. Then, after removing the photoresist film pattern, an exposed portion of the silicon substrate 20 is etched with a predetermined depth by using a remaining pad nitride layer as a mask, so that a trench 23 is formed.

Then, in order to remove stress created when the trench 23 is etched and to protect the silicon substrate 20, a sacrificial oxide layer (not shown) is formed on the silicon substrate 20 having the trench 23 and is removed. Then, a thin oxide layer 24 is formed through a sidewall oxidation process.

Thereafter, as shown in FIG. 2b, a predetermined nitride layer 25 and a predetermined oxide layer 26 are sequentially formed on an upper surface of a resultant structure, including the thin oxide layer 24. At this time, the nitride layer 25 may reduce a depth of a moat formed at a predetermined portion, in which a silicon active region meets the isolation layer, based on an etching selectivity between the nitride layer and the isolation layer. In addition, the oxide layer 26 can prevent loss of the nitride layer 25.

Then, a gap-fill oxide layer 27 is formed on an entire surface of a trench structure including the oxide layer 26 by a CVD process. At this time, an $Al_2O_3$ layer 27 is used, instead of a conventional HDP oxide layer, as a gap-fill oxide layer. The $Al_2O_3$ layer 27 is formed through depositing one of trimethyl-aluminum and triethyl-aluminum, as a source, under at a temperature of about 300~500° C. with pressure of about 0.1~5 torr. In addition, the depositing process is carried out in single type equipment or batch type equipment.

Meanwhile, the $Al_2O_3$ layer must have a wet-etch rate less than 0.5 Å/sec in HF chemical having a ratio of 50:1 in such a manner that the $Al_2O_3$ layer is not damaged in the following wet-etch process.

Figure 2C:
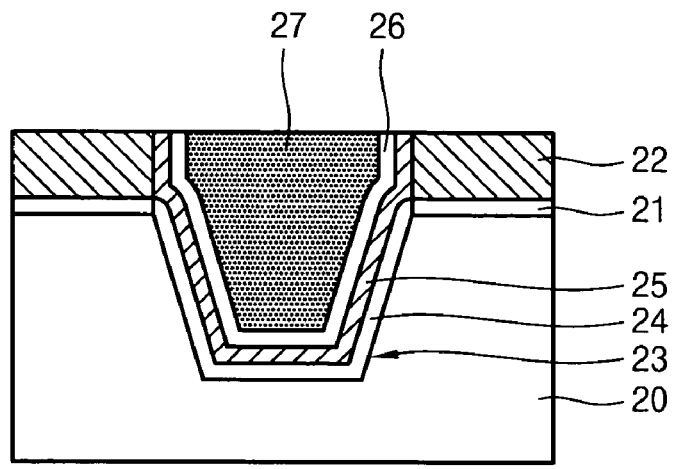

Thereafter, as shown in FIG. 2c, the gap-fill oxide layer, the $Al_2O_3$ layer, the oxide layer, and the nitride layer are polished through the CMP process in order to expose the pad nitride layer 22.

Figure 2D:
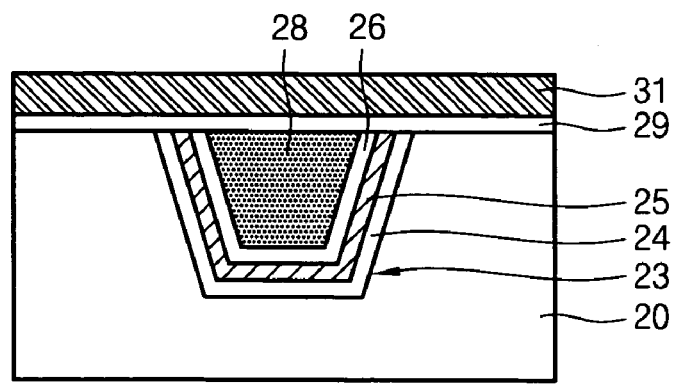

Then, as shown in FIG. 2d, after the pad nitride layer is removed through the wet-etch process using phosphoric acid solution, the pad oxide layer is removed by dipping a resultant substrate in fluoride acid solution, thereby forming a trench type isolation layer 28. At this time, the isolation layer made from $Al_2O_3$ material is not etched, even if the wet-etch process using chemical, such as phosphoric acid solution or fluoride acid solution, is carried out with respect to the isolation layer.

Thereafter, a gate oxide layer 29 and poly crystalline silicon layer 31 for forming a gate are sequentially deposited on an entire surface of a silicon substrate including the isolation layer 28.

As described above, according to the present invention, an $Al_2O_3$ layer having a low wet-etch rate is used as a gap-fill oxide layer filling a trench for isolating a device. Accordingly, loss of an oxide layer created in the following wet-etch process is minimized, and it is possible to adjust a height of an isolation layer and a size of a device region to a predetermined level.

Therefore, according to the present invention, since a characteristic value of a semiconductor device can be easily predicted, a yield rate can be improved while ensuring stability.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for forming an isolation layer of a semiconductor device, the method comprising the steps of:
   i) providing a semiconductor substrate having a predetermined isolation region;
   ii) sequentially forming a pad oxide layer and a pad nitride layer exposing the predetermined isolatIon region on the semiconductor substrate;
   iii) forming a trench through etching the semiconductor substrate by a predetermined thickness using the pad nitride layer as a mask;
   iv) forming a wall oxide layer at a side wall of the trench;
   v) sequentially forming a nitride layer and an oxide layer on a trench structure including the wall oxide layer;
   vi) forming an $Al_2O_3$ layer on an entire surface of a resultant structure, wherein the $Al_2O_3$ layer has a wet etch rate less than 0.5 Å/sec in HF solution having a ratio of 50:1 to prevent damage to the $Al_2O_3$ layer during a subsequent wet etching step;
   vii) planarizing the $Al_2O_3$ layer through polishing the $Al_3O_3$ layer, and
   viii) removing the pad nitride layer and the pad oxide layer by one or more wet etching processes without damaging the $Al_2O_3$ layer.

2. The method as claimed in claim 1, wherein the $Al_2O_3$ layer is deposited under a temperature of about 300~500° C.

3. The method as claimed in claim 1, wherein the $Al_2O_3$ layer is deposited under a pressure of about 0.1~5 torr.

4. The method as claimed in claim 1, wherein a deposition process for the $Al_2O_3$ layer is carried out in single type equipment or batch type equipment.

5. The method as claimed in claim 1, wherein the $Al_2O_3$ layer is formed by using one of trimethyl-aluminum and triethyl-aluminum as a source.

6. The method as claimed in claim 1, wherein the pad oxide layer is removed by dipping the substrate having the layers formed thereon in a fluoride acid solution.

7. The. method as claimed in claim 1, wherein the $Al_2O_3$ layer is formed through depositing triethyl-aluminum as a source gas at a temperature of 300 to 500 degree Celsius at a pressure of 0.1 to 5 torr.

8. The method as claimed in claim 1, wherein the $Al_2O_3$ layer is formed through depositing trimethyl-aluminum as a source gas at a temperature of 300 to 500 degree Celsius at a pressure of 0.1 to 5 torr.

9. The method as claimed in claim 7 further comprising the step of forming a gate oxide layer on the substrate and the isolation layer.

10. The method as claimed in claim 8 further comprising the step of forming a polycrystalline silicon layer on the gate oxide layer.

* * * * *